(12) United States Patent
Agarwal et al.

(10) Patent No.: US 8,146,026 B2
(45) Date of Patent: Mar. 27, 2012

(54) SIMULTANEOUS PHOTOLITHOGRAPHIC MASK AND TARGET OPTIMIZATION

(75) Inventors: Kanak B. Agarwal, Austin, TX (US); Shayak Banerjee, Austin, TX (US); Damir A. Jamsek, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 269 days.

(21) Appl. No.: 12/619,742

(22) Filed: Nov. 17, 2009

(65) Prior Publication Data

US 2011/0119642 A1 May 19, 2011

(51) Int. Cl.
*G06F 17/50* (2006.01)
(52) U.S. Cl. ................. 716/56; 716/52; 716/53
(58) Field of Classification Search ............... None
See application file for complete search history.

(56) References Cited

U.S. PATENT DOCUMENTS

| | | |
|---|---|---|
| 6,578,190 B2 | 6/2003 | Ferguson et al. |
| 6,961,916 B2 | 11/2005 | Sarrafzadeh et al. |
| 6,961,920 B2 | 11/2005 | Zach |
| 6,978,438 B1 | 12/2005 | Capodieci |
| 7,237,221 B2 | 6/2007 | Granik et al. |
| 7,318,214 B1 | 1/2008 | Prasad et al. |
| 7,325,224 B2 | 1/2008 | Seltmann et al. |
| 7,355,673 B2 | 4/2008 | Hsu et al. |
| 7,396,621 B2 | 7/2008 | Fujisawa |
| 7,434,199 B2 | 10/2008 | Cobb et al. |
| 7,451,068 B2 | 11/2008 | Melvin, III |
| 7,694,267 B1 | 4/2010 | Ye et al. |
| 7,784,019 B1 | 8/2010 | Zach |
| 7,865,864 B2 | 1/2011 | Banerjee et al. |
| 2005/0026310 A1 | 2/2005 | Zhao et al. |
| 2005/0196682 A1 | 9/2005 | Hsu et al. |
| 2006/0024850 A1 | 2/2006 | Monahan et al. |
| 2006/0026541 A1 | 2/2006 | Melvin et al. |
| 2006/0277521 A1 | 12/2006 | Chen et al. |
| 2007/0209030 A1 | 9/2007 | Tabery et al. |
| 2007/0266362 A1 | 11/2007 | Lai et al. |
| 2008/0022255 A1 | 1/2008 | Zach |
| 2008/0046846 A1 | 2/2008 | Chew et al. |
| 2008/0193859 A1 | 8/2008 | Hamouda |
| 2008/0248412 A1 | 10/2008 | Stuber et al. |
| 2008/0263483 A1 | 10/2008 | Koike et al. |
| 2009/0030636 A1 | 1/2009 | Pan et al. |
| 2009/0144691 A1 | 6/2009 | Rathsack et al. |

(Continued)

OTHER PUBLICATIONS

Bruce et al., "Model-based verification for first time right manufacturing," Proc. of SPIE, vol. 5756, 2005, pp. 198-207.*

(Continued)

*Primary Examiner* — Leigh Garbowski
(74) *Attorney, Agent, or Firm* — Francis Lammes; Stephen J. Walder, Jr.; Libby Z. Toub

(57) ABSTRACT

A mechanism is provided for simultaneous photolithographic mask and target optimization (SMATO). A lithographic simulator generates an image of a mask shape on a wafer thereby forming one or more lithographic contours. A mask and target movement module analytically evaluates a direction for mask and target movement thereby forming a plurality of pairs of mask and target movements. The mask and target movement module identifies a best pair of mask and target movements from the plurality of mask and target movements that minimizes a weighted cost function. A shape adjustment module adjusts at least one of a target shape or the mask shape based on the best pair of mask and target movements.

20 Claims, 10 Drawing Sheets

U.S. PATENT DOCUMENTS

| | | |
|---|---|---|
| 2009/0148783 A1 | 6/2009 | Socha |
| 2009/0199151 A1 | 8/2009 | Banerjee et al. |
| 2010/0122231 A1 | 5/2010 | Agarwal et al. |
| 2010/0180251 A1 | 7/2010 | Ye et al. |
| 2010/0269079 A1 | 10/2010 | Banerjee et al. |
| 2010/0333049 A1 | 12/2010 | Agarwal et al. |
| 2011/0119642 A1 | 5/2011 | Agarwal et al. |
| 2011/0124193 A1 | 5/2011 | Cheng et al. |
| 2011/0138342 A1 | 6/2011 | Agarwal |
| 2011/0145770 A1 | 6/2011 | Brooks et al. |
| 2011/0150343 A1 | 6/2011 | Agarwal et al. |
| 2011/0271238 A1 | 11/2011 | Mansfield et al. |

OTHER PUBLICATIONS

Cobb et al., Mathematical and CAD Framework for Proximity Correction, Proc. of SPIE, vol. 2726, Jun. 1996, pp. 208-222.*

Cobb et al., "Fast Sparse Aerial Image Calculation for OPC," Proc. of SPIE, vol. 2621, 1995, pp. 534-545.*

Cobb et al., "Flexible sparse and dense OPC algorithms," Proc. of SPIE, vol. 5853, 2005, pp. 693-702.*

Cobb et al., "Model-Based OPC using the Meef Matrix," Proc. of SPIE, vol. 4889, 2002, pp. 1282-1292.*

Cobb et al., "Using OPC to optimiza for image slope and improve process window," Proc. of SPIE, vol. 5130, 2003, pp. 838- 846.*

Kobayashi et al., "Automated hot-spot fixing system applied for metal layers of 65-nm logic devices," J. Micro/Nanolith. MEMS MOEMS 6(3), 2007, 6 pages.*

Krasnoperova et al., "Process Window OPC for Reduced Process Variability and Enhanced Yield," Proc. of SPIE, vol. 6154, 2006, 12 pages.*

Liebmann et al., "Optimizing Style Options for Sub-Resolution Assist Features," Proc. of SPIE, vol. 4346, 2001, pp. 141-152.*

Liebmann et al., "Reducing DfM to Practice: the Lithography Manufacturability Assessor," Proc. of SPIE, vol. 6156, 12 pages.*

Liu et al., "Optimal binary image design for optical lithography," Proc. of SPIE, vol. 1264, 1990, pp. 401-412.*

Mansfield et al., "Through-process modeling for design-for-manufacturability applications," J. Micro/Nanolith. MEMS MOEMS 6(3), 2007, 9 pages.*

Torres et al., "Integrated Circuit DFM Framework for Deep Sub-Wavelength Processes," Proc. of SPIE 5756, 2005, pp. 39-50.*

Yang et al., "Model-Based Retarget for 45nm Node and Beyond," Proc. Of SPIE, vol. 7274, 2009, 8 pp.*

Cobb et al., "Fast Sparse Aerial Image Calculation for OPC," Proc. of SPIE, vol. 2621, 1995, pp. 534-545.*

Cobb et al., "Flexible sparse and dense OPC algorithms," Proc. of SPIE, vol. 5853, 2005, pp. 693-702.*

Kobayashi et al., "Automated hot-spot fixing system applied for metal layers of 65-nm logic devices," J. Micro/Nanolith. MEMS MOEMS 6(3), 2007, 6 pages.*

Liebmann et al., "Reducing DfM to Practice: the Lithography Manufacturability Assessor," Proc. of SPIE, vol. 6156, 12 pages.*

Liu et al., "Optimal binary image design for optical lithography," Proc. of SPIE, vol. 1264, 1990, pp. 401-412.*

Mansfield et al., "Through-process modeling for design-for-manufacturability applications," J. Micro/Nanolith. MEMS MOEMS 6(3), 2007, 9 pages.*

Torres et al., "Integrated Circuit DFMm Framework for Deep Sub-Wavelength Processes," Proc. of SPIE, vol. 5756, 2005, pp. 39-50.*

Yang et al., "Model-Based Retarget for 45nm Node and Beyond," Proc. of SPIE, vol. 7274, 2009, 8 pages.*

Agarwal, Kanak B. et at., "Model-Based Retargeting of Layout Patterns for Sub-Wavelength Photolithography". U.S. Appl. No. 12/492.301, filed Jun. 26.2009, 34 pages.

Cao, KE et al., "Standard Cell Characterization Considering Lithography Induced Variations", Design Automation Conference, 2006 43rd ACM/IEEE, pp. 801-804.

Heloue, Khaled R. et al., "Early Analysis and Budgeting of Margins and Corners Using Two-Sided Analytical Yield Models", Computer-Aided Design of Integrated Circuits and Systems, IEEE Transactions on vol. 27. Issue 10, Oct. 2008—pp. 1826-1839.

Hsiao, Chia-Chi et al., "On Distinguishing Process Corners for Yield Enhancement in Memory Compiler Generated SRAM". Memory Technology, Design, and Testing, 2009. MTDT 2009. IEEE International Workshop on; Aug. 31. 2009-Sep. 2, 2009, pp. 83-87.

Kawashima. Shinichi et al., "Implementation Requirements for Edge Exclusion Area Reduction for Maximized Output of Chips from a 200mm Wafer", Semiconductor Manufacturing, 2000, Proceedings of ISSM 2000, The Ninth International Symposium on; Sep. 26-28, 2000, pp. 98-101.

Wong, K at al., "Development of new methodology and technique to accelerate region yield improvement", Advanced Semiconductor Manufacturing Conference and Workshop, 1998. 1998 IEEE/SEMI: Sep. 23-25, 1998, pp. 82-85.

Yu, Peng et at. "Process Variation Aware OPC with Variational Lithography Modeling", Design Automation Conference 2006 43rd ACM/IEEE, 785-790.

U.S. Appl. No. 12/024,188, 2 pages.
U.S. Appl. No. 12/492,301, 1 page.
U.S. Appl. No. 12/630,216, 1 page.
U.S. Appl. No. 12/845,527, 1 page.
U.S. Appl. No. 12/770,791, 1 page.

Banerjee. S et al., "Compensating non-optical effects using electrically driven optical proximity correction", Proceedings of the SPIE—The International Society for Optical Engineering, vol. 7275, 2009, Design for Manufacturability through Design—Process Integration III Conference, Feb. 26-27, 2009. Abstract only, 1 page.

Koike. K et al., "OPC to reduce variablity of transistor properties", Proceedings of the SPIE—The International Society for Optical Engineering, vol. 6521, Design for Maufacturing through Design-Process Integration Conference, Feb. 28, 2007, Abstract only, 1 page.

Teh, Siew-Hong et al., "Device Performance-based OPC for Optimal Circuit Performances and Mask Cost Reduction", Proceedings of SPIE, vol. 6925, 692511, 2008, 8 pages.

Interview Summary mailed Nov. 30, 2011 for U.S. Appl. No. 12/492,301, 4 pages.

Response to Offoce Action filed with the USPTO on Jan. 6, 2012 for U.S. Appl. No. 12/630,216, 14 pages.

Response to Office Action filed with the USPTO on Nov. 9, 2011 for U.S. Appl. No, 12/492,301, 20 pages.

* cited by examiner

SIMULTANEOUS PHOTOLITHOGRAPHIC MASK AND TARGET OPTIMIZATION

BACKGROUND

The present application relates generally to an improved data processing apparatus and method and more specifically to an apparatus and method for simultaneous photolithographic mask and target optimization.

Optical lithography is a crucial step in semiconductor manufacturing. The basic principle of optical lithography is quite similar to that of chemistry-based photography. The images of the patterned photo-mask are projected through the high-precision optical system onto the wafer surface, which is coated with a layer of light-sensitive chemical compound, e.g. photo-resist. The patterns are then formed on the wafer surface after complex chemical reactions and follow-on manufacturing steps, such as development, post-exposure bake, and wet or dry etching.

The resolution of the photo-lithography system (R) can be described by the well-known Rayleigh's equation:

$$R = \frac{k_1 \lambda}{NA}$$

in which $\lambda$ is the wavelength of the light source, NA is the numerical aperture, and $k_1$ is the factor describing the complexity of resolution enhancement techniques. As the very-large-scale integration (VLSI) technology pushes further into nanometer region, the feasible wavelength of the photo-lithographic system remains unchanged at 193 nm. Although there is anticipation that extreme ultraviolet lithography (EUVL) with the wavelength of 13 nm will replace traditional optical lithography, the availability of EUVL remains uncertain due to technical challenges and cost issues. On the other hand, the physical limit of dry lithography of NA is 1.0. The recently introduced immersion lithography has bigger NA (1.2), but it is harder to further increase NA to even higher values. Thus it is commonly recognized that $k_1$ remains a cost effective knob to achieve finer resolution.

Due to the unavoidable diffraction, the optical lithography system is lossy in the sense that only low frequency components of the electromagnetic field can pass the optical system. Given a target layout of shapes that are desired to be manufactured, masks are generated that account for the non-linearities introduced by the lithographic process that prints wafer features that resemble the target. As the gap between the required feature size and lithography wavelength gets bigger, the final wafer images are quite different from the patterns on the mask. In the past few years, resolution enhancement techniques (RETs) have become necessary in order to achieve the required pattern density. One well-known RET is the optical proximity correction (OPC), in which the mask patterns are intentionally "distorted" so that the desired image can be formed on the wafer. Other commonly used RETs are sub-wavelength resolution assist features (SRAF) and phase-shift masks (PSM). Nowadays, considerable amount of computing power has to be dedicated to these post-layout processes (often referred as data prep). Large computer farms have to spend weeks of central processing unit (CPU) time to perform data prep after a design is completed. However, all these RET methods have one significant drawback: there is no guarantee the achieved results will be optimal. Furthermore, as the technology is further pushed, manufacturing variations (e.g., dose and focus variations during the lithograph steps) have to be considered. However, it is quite challenging to systematically incorporate the process variations into the traditional RETs.

The goal of process variation aware RET is to maximize process window. Process window is defined as the range of exposure dose and defocus values for which the printed image is within a required tolerance. Process variation aware RET methods such as process window OPC (PW-OPC) distort mask patterns to maintain image fidelity at multiple dose and focus corners. However in the low $k_1$ regime, the mask optimization techniques by themselves are not sufficient to obtain acceptable common process window for all possible layout patterns that are permitted by the technology ground rules.

SUMMARY

In one illustrative embodiment, a method, in a data processing system, is provided for simultaneous photolithographic mask and target optimization (SMATO). The illustrative embodiment generates an image of a mask shape on a wafer thereby forming one or more lithographic contours which closely match a provided set of target shapes. The illustrative embodiment analytically evaluates a direction for mask and target movement thereby forming a plurality of pairs of mask and target movements. The illustrative embodiment identifies a best pair of mask and target movements from the plurality of mask and target movements that minimizes a weighted cost function. The illustrative embodiment adjusts at least one of a target shape or the mask shape based on the best pair of mask and target movements.

In other illustrative embodiments, a computer program product comprising a computer useable or readable medium having a computer readable program is provided. The computer readable program, when executed on a computing device, causes the computing device to perform various ones, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Target layout is a set of shapes that are transferred from design to manufacturing and represent the electrical intent of the design. Common lithographic processing of a layout may be improved by local perturbation of target patterns in some instances. The perturbation of the target layout is known as retargeting. Retargeting modifies the target layout shapes as opposed to optical proximity correction (OPC) which optimizes mask shapes for a given target. The illustrative embodiments provide a mechanism for simultaneous optimization of a target and a mask to achieve image fidelity and improved robustness of photolithographic layouts. The simultaneous optimization uses a weighted function of image log slope (ILS) and intensity error to balance fidelity and robustness. Higher image slope gives more robustness to process variation and lower intensity error gives better image fidelity. Optimization is guided by an analytical computation of sensitivity of cost function for mask and target movement.

Figure 1:
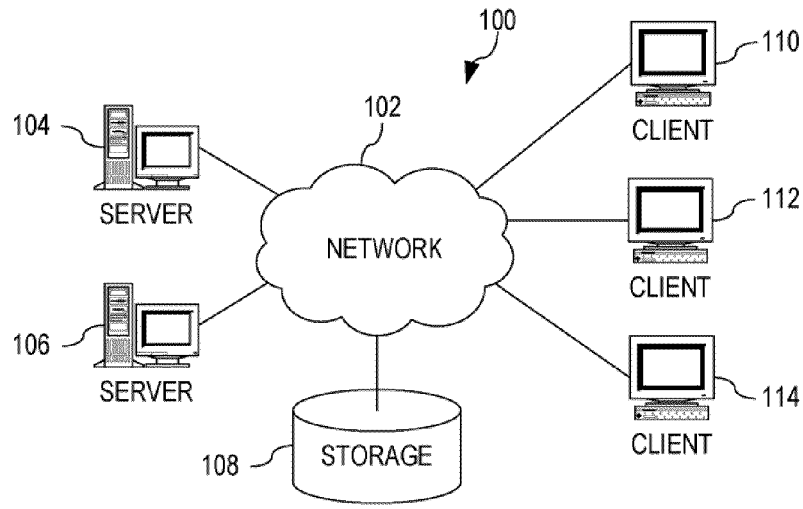
FIG. 1 depicts a pictorial representation of an example distributed data processing system in which aspects of the illustrative embodiments may be implemented.
Figure 2:
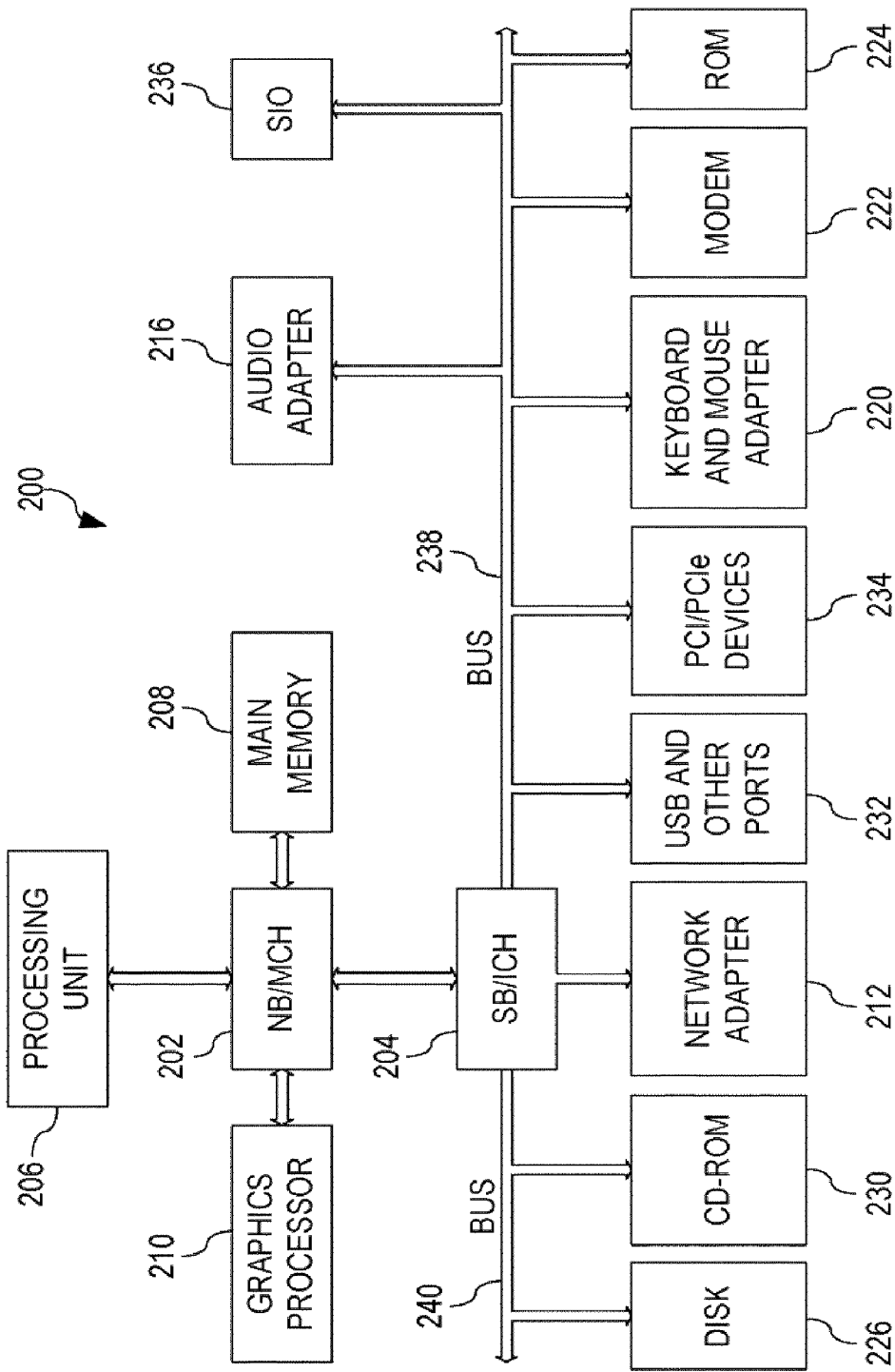
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1 and 2 are provided hereafter as example environments in which aspects of the illustrative embodiments may be implemented. While the description following FIGS. 1 and 2 will focus primarily on a single data processing device implementation of simultaneous photolithographic mask and target optimization, this is only an example and is not intended to state or imply any limitation with regard to the features of the present invention. To the contrary, the illustrative embodiments are intended to include distributed data processing environments and embodiments in which masks and targets may be simultaneously optimized for photolithographic layouts.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
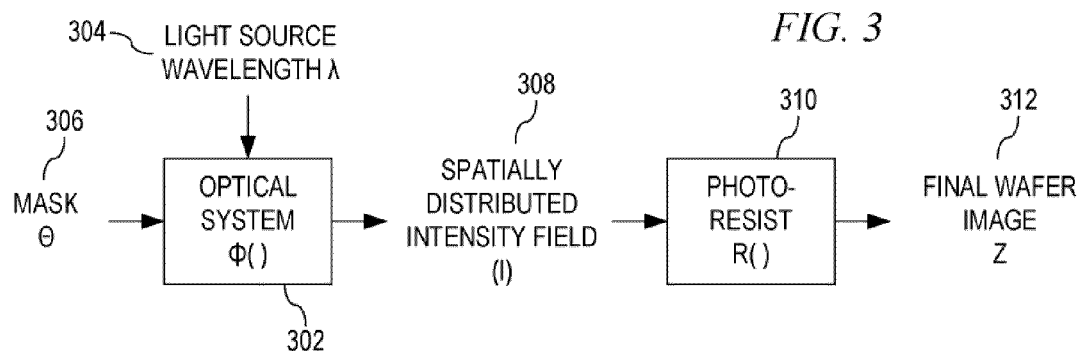
FIG. 3 illustrates a highly simplified schematic view of a state-of-the-art optical lithography process.

FIG. 3 illustrates a highly simplified schematic view of a state-of-the-art optical lithography process. In optical system ($\Phi(\ )$) 302, light source 304 of wavelength $\lambda$ projects through received mask ($\Theta$) 306 to achieve a spatially distributed intensity field (I) 308 on the wafer source. After chemical reactions of photo-resist (R( )) 310 on the wafer source, final wafer image (Z) 312 forms on the wafer source.

The currently known retargeting methods are rule-based. The rule-based methods apply a certain set of retargeting rules to the target shapes before passing the modified shapes to the OPC tool. The retargeting rules may be developed through extensive image simulations on an initial set of representative layout constructs. The rules developed from these experiments may also be applied to retarget any generic layout. The issues with rule-based retargeting are analogous to issues with rule-based OPC. Some problems with rule-based retargeting include: the practical impossibilities to enumerate exponential number of 2-D layout configurations for retargeting rule development, the possibility of a layout hot-spot escape in some cases that are fixable by retargeting but not covered by retargeting rules, the inability to express certain complex 2-D layout patterns and corresponding retargeting operations by rules, the context dependence where some layout constructs require different amounts of retargeting in different instances, and the need to constantly update current retargeting rules with changes in the models or the resolution enhancement technique (RET) recipe.

In another illustrative embodiment a retargeting mechanism is provided for optimizing target shapes using normalized image log slope (NILS). NILS is a measure of image robustness and is directly proportional to exposure latitude. Exposure latitude represents the percentage change in exposure for which printed linewidth does not violate the required tolerance specifications. NILS is expressed as:

$$w = \frac{\partial \ln I(x)}{\partial x}$$

where I(x) represents the spatial aerial image intensity and w is the feature width. Higher NILS indicates that the features are more robust to lithographic variation while lower NILS indicates increased susceptibility of the shapes to lithographic process variability.

Figure 4:
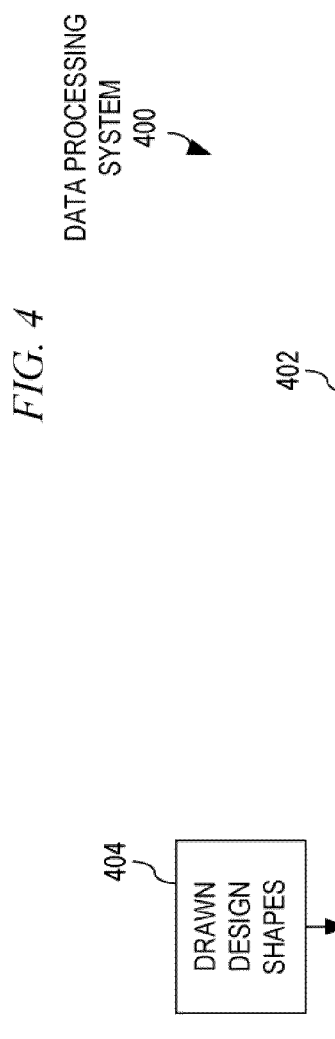
FIG. 4 depicts a block diagram of a normalized image log slope (NILS)-based retargeting mechanism for photolithographic layouts that uses normalized image log slope in accordance with an illustrative embodiment.

FIG. 4 depicts a block diagram of a normalized image log slope (NILS)-based retargeting mechanism for photolithographic layouts that uses normalized image log slope in accordance with an illustrative embodiment. NILS-based retargeting mechanism 402 in data processing system 400 initially receives drawn design shape 404 from a designer. NILS-based retargeting mechanism 402 uses drawn design shapes 404 as initial target shapes 406. NILS-based retargeting mechanism 402 then performs a decomposition of the target shapes 406 for multiple exposure lithography using decomposition module 408. Decomposition module 408 is not needed when single exposure is used. After decomposition module 408 decomposes target shapes 406 into decomposed target patterns 410, then optical proximity correction module 412 performs a small number of initial optical proximity correction iterations on decomposed target patterns 410. The initial OPC iterations may be zero meaning that the initial OPC iterations may be skipped altogether. Instead of retargeting after all optical proximity corrections are complete as is known in the current art, NILS-based retargeting integrates retargeting with OPC iterations based on NILS measurements.

NILS-based retargeting mechanism 402 provides for optical proximity correction module 412 to perform optical proximity correction up to a maximum predetermined number of iterations. Therefore, each time optical proximity correction module 412 performs an optical proximity correction, iteration counter 424 within NILS-based retargeting mechanism 402 increments. Once the value of iteration counter 424 exceeds the maximum predetermined number of iterations, lithographic simulator 413 performs simulations on post OPC mask shapes and produces lithographic contours 414. NILS extraction module 422 then performs a NILS extraction from one or more lithographic contours 414. NILS extraction may be performed after each OPC iteration in which case the maximum predetermined number of OPC iterations is set to one. Alternatively, NILS extraction may be performed after every few OPC iterations. The maximum number of OPC iterations between two successive NILS extractions may also be dynamically controlled.

For each target edge fragment and corresponding one or more lithographic contours 414, NILS extraction module 422 computes two types of NILS; NILS for width (WNILS) and NILS for space (SNILS). NILS extraction module 422 identifies all the target edges with low NILS. Low WNILS are indicative of potential pinching or minimum width areas and low SNILS are indicative of potential bridging or minimum spacing areas. NILS extraction module 422 uses a heuristics-based approach for target resizing. If NILS extraction module 422 identifies a target edge fragment with low WNILS, then NILS extraction module 422 moves the target edge fragment out by a predetermined specified amount. If NILS extraction module 422 identifies a target edge fragment with low SNILS, then NILS extraction module 422 moves the target edge fragment in by a predetermined specified amount. If NILS extraction module 422 identifies a target edge fragment with both low WNILS and low SNILS, then NILS extraction module 422 performs no movement of the target edge fragment.

Retargeting module 418 modifies the target shapes based on NILS values from NILS extraction module 422. That is, retargeting module 418 biases, target edge fragments similar to the operation performed by optical proximity correction 412 on mask edge fragments. Once retargeting module 418 has performed retargeting, retargeting module 418 sends the new target patterns to optical proximity correction module 412 for a next set of OPC iterations. When NILS extraction module 422 determines that NILS is within a predetermined limit or NILS may not be improved any further by retargeting, then the retargeting process stops and NILS-based retargeting mechanism 402 performs final OPC iterations and produces clean mask shapes 420.

Thus, retargeting module 418 in association with NILS extraction module 422 modifies target shapes 406 provided by the designer to generate new target shapes that have better printability. Retargeting using NILS extraction may eliminate optical rule checking errors that are not fixable by optical proximity correction. Retargeting using NILS is very cost-effective because, in NILS-based retargeting, it is not required to run full OPC and process window optical rule checking for each retargeting iteration. NILS-based retargeting may be embedded within OPC iterations. Retargeting may be performed by extracting NILS from aerial image simulations used by the OPC module resulting in small run-time overhead.

Figure 5A:
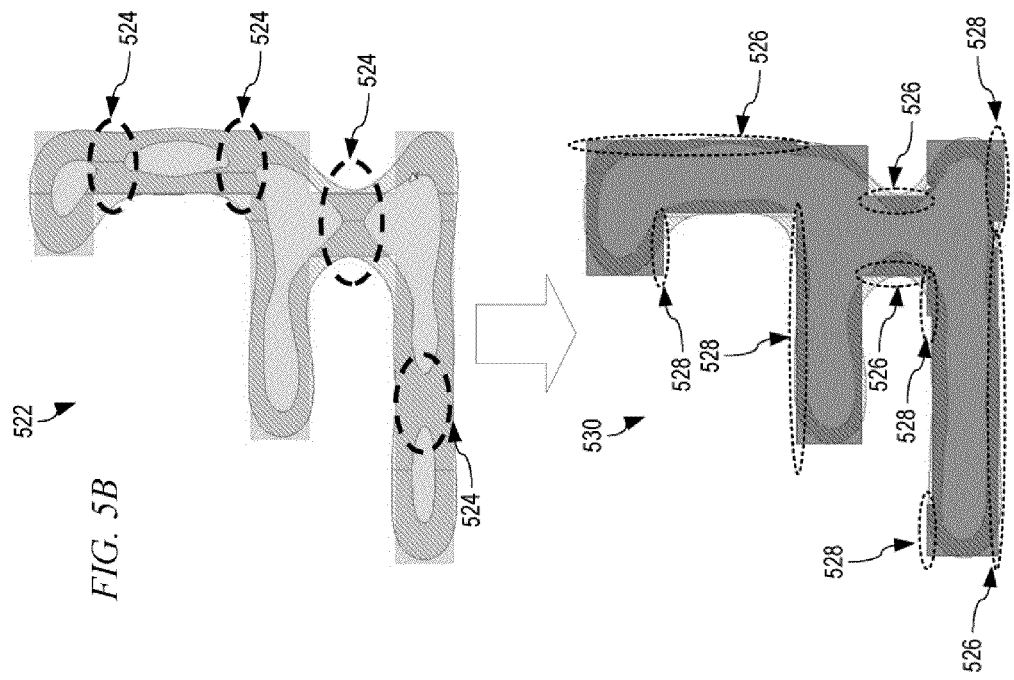
FIGS. 5A and 5B depict an example of retargeting performed by a model-based retargeting mechanism using NILS extraction in accordance with an illustrative embodiment.
Figure 5B:
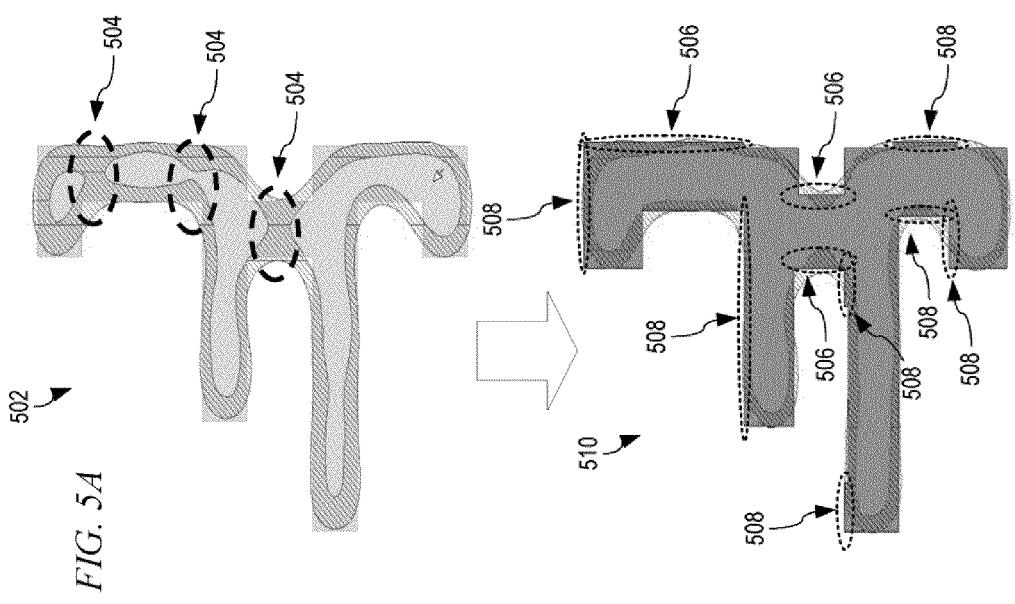

FIGS. 5A and 5B depict an example of retargeting performed by a model-based retargeting mechanism using NILS extraction in accordance with an illustrative embodiment. After decomposition and optical proximity correction of an initial target shape, process variability bands (PV-bands) produced by aerial image contours across dose and focus corners of target shapes 502 and 522 indicate errors that comprise areas of pinching 504 and 524. These results show that in the absence of retargeting, the image fidelity is not-maintained across process window. NILS-based retargeting adds shapes 506, 508, 526, and 528 to target shapes 510 and 530 that result in better PV-bands and no pinching errors.

In order to improve on retargeting that modifies the target layout shapes and uses optical proximity correction (OPC) to optimize mask shapes for a given target as described in FIG. 4, the illustrative embodiments provide a mechanism for simultaneous optimization of a target and a mask to achieve image fidelity and improve robustness of photolithographic layouts. The simultaneous optimization uses a weighted function of image log slope (ILS) and intensity error to balance fidelity and robustness. Higher image slope gives more robustness to process variation and lower intensity error gives better image fidelity. Optimization is guided by an analytical computation of sensitivity of cost function for mask and target movement.

Figure 6:
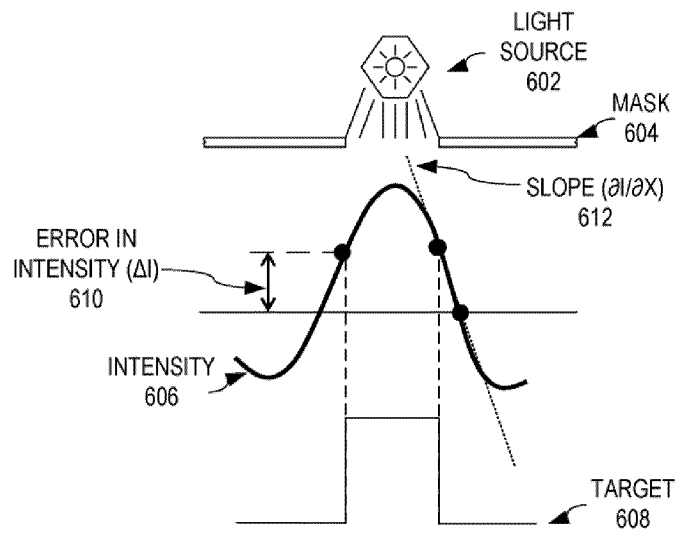
FIG. 6 shows a diagram depicting weight as a function of an optical proximity correction (OPC) iteration in accordance with an illustrative embodiment.

FIG. 6 shows a diagram depicting weight as a function of an optical proximity correction (OPC) iteration in accordance with an illustrative embodiment. As described above, in an optical system, a light source of wavelength λ projects through a received mask to achieve a spatially distributed intensity field on a wafer source. In the diagram, as light source 602 projects through mask 604, the intensity of light 602 is higher in the center of the open area and lower at the edges of mask 604 as is shown in function of intensity 606. In order to improve the image fidelity and robustness of the photolithographic layout so that the produced image is closer to desired target 608, the illustrative embodiment identifies an error in the intensity (ΔI) 610 and a slope (∂I/∂x) 612 of the function of intensity 606. The object of the illustrative embodiment is to minimize the error in intensity (ΔI) 610 while maximizing the slope (∂I/∂x) 612. In order to both minimize the error in intensity (ΔI) 610 and maximize the slope (∂I/∂x) 612, the illustrative embodiments use a weighted cost function:

$$C_{SMATO} = w_i(\Delta I) + (1 - w_i)\frac{1}{(\partial I / \partial x)}$$

In this equation, the weight ($w_i$) changes over each OPC iteration (i), thus the illustrative embodiment initially minimizes the error in intensity (ΔI) 610 to match the target, then retarget to maximize the slope (∂I/∂x) 612 and finish by matching the simulated contour to the target.

Figure 7:
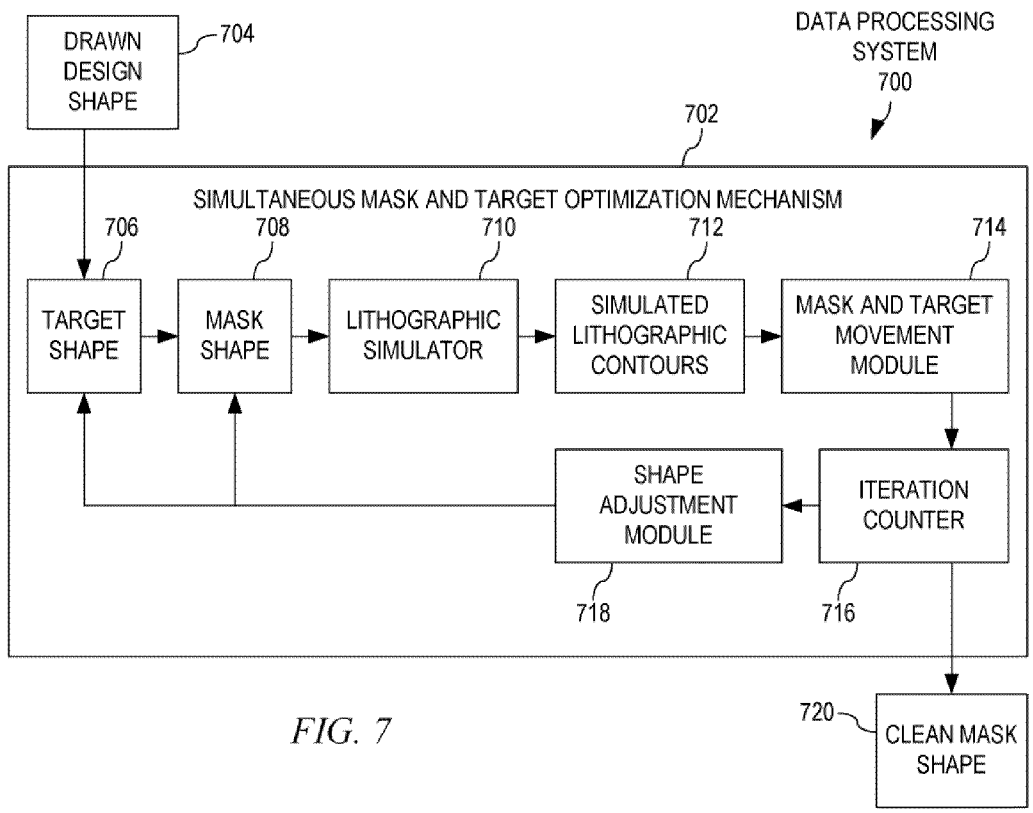
FIG. 7 depicts a block diagram of a simultaneous mask and target optimization for photolithographic layouts in accordance with an illustrative embodiment.

FIG. 7 depicts a block diagram of a simultaneous mask and target optimization for photolithographic layouts in accordance with an illustrative embodiment. Simultaneous mask and target optimization (SMATO) mechanism 702 in data processing system 700 initially receives drawn design shape 704 from a designer. SMATO mechanism 702 uses drawn design shape 704 as initial target shape 706. SMATO mechanism 702 then generates initial mask shape 708. During the first pass, SMATO mechanism 702 generates initial mask shape 708 that may be substantially the same as initial target shape 706. SMATO mechanism 702 then performs a lithographic simulation of mask shape 708 using lithographic simulator 710 to generate an image of the mask on a wafer, which may be referred to as simulated lithographic contours 712. After lithographic simulator 710 generates simulated lithographic contours 712, then mask and target movement module 714 analytically evaluates the best direction for mask and target movement and performs such modifications for both mask shape 708 and target shape 706.

For each of target shape 706 and mask shape 708, mask and target movement module 714 evaluates three movements: mask in, mask out, no mask movement, target in, target out, and no target movement. Using these movements, the cost function described in FIG. 6 is evaluated at nine points:

| | | |
|---|---|---|
| $C(m_0, n_0 - \eta, -\lambda)$ | $C(m_0, n_0 - \eta, 0)$ | $C(m_0, n_0 - \eta, +\lambda)$ |
| $C(m_0, n_0, -\lambda)$ | $C(m_0, n_0, 0)$ | $C(m_0, n_0, +\lambda)$ |
| $C(m_0, n_0 + \eta, -\lambda)$ | $C(m_0, n_0 + \eta, 0)$ | $C(m_0, n_0 + \eta, +\lambda)$ | where the movement in target shape 706 is $+/-\eta$ and the movement in simulated mask 710 is $+/-\lambda$ and where $\eta$ and $\lambda$ are predetermined distances for target and mask movement, respectively. Thus, the weighted cost function is now evaluated as:

$$C_{SMATO}(m_0, n_0, n_m) =$$
$$w_i[I(m_0, n_0) + \delta I^{n_m}(m_0, n_0) - I_{th}] + (1 - w_i)\frac{1}{\nabla I(m_0, n_0) + \delta \nabla I^{n_m}(m_0, n_0)}$$

where $(m_0, n_0)$ is the initial location of the center of the target edge (in a two-dimensional co-ordinate system), and $n_m$ is the movement in the mask. Using the nine points, mask and target movement module 714 determines the weighted cost function for each of the nine points and identifies the best pair of target and mask movement then minimizes C for the simultaneous mask and target movement (SMATO). Once mask and target movement module 714 identifies the best pair of target and mask movement, shape adjustment module 718 adjusts target shape 706 and/or mask shape 708 using the identified mask and target movements.

SMATO mechanism 702 provides for mask and target movement module 714 to analytically evaluate of the best direction for mask and target movement up to a maximum predetermined number of iterations. Therefore, each time mask and target movement module 714 analytically evaluates the best direction for mask and target movement in mask shape 708 and target shape 706, iteration counter 716 within SMATO mechanism 702 increments and shape adjustment module 718 adjusts mask shape 708 to produce modified mask shape 708 and/or adjusts target shape 706 to produce modified target shape 706. Once the value of iteration counter 716 exceeds the maximum predetermined number of iterations, SMATO mechanism 702 produces clean mask shape 720.

Thus, SMATO mechanism 702 provides for simultaneous optimization of a target and a mask to achieve image fidelity and improved robustness of photolithographic layouts. The simultaneous optimization uses a weighted function of image log slope (ILS) and intensity error to balance fidelity and robustness. Higher image slope gives more robustness to process variation and lower intensity error gives better image fidelity. Optimization is guided by an analytical computation of sensitivity of cost function for mask and target movement.

Mask and target movement module 714 also uses a set of equations in order to analytically evaluate the effect of movement in mask shape 708 and/or target shape 706 using the weighted cost function. The development of the following equations is based on Hopkins equations for partial coherence applied to the grid-based simulation system. Previous research has shown how to analytically predict the impact of mask movement on edge placement error (EPE). However, such research was concentrated within the "Sparse OPC" framework, where intensity computation was only performed at fixed sites. However, since the 65 nm node, OPC tools have progressed to a pixel-based method for simulation, also referred to as the "Dense OPC" framework. The shift was necessitated by the computational improvements in performing grid-based simulations in the presence of an increasingly large number of polygons. The illustrative embodiments advance the analytical equation development to this pixel-based framework and further show how to predict the impact of both mask and target movement on image slope and intensity.

Figure 8:
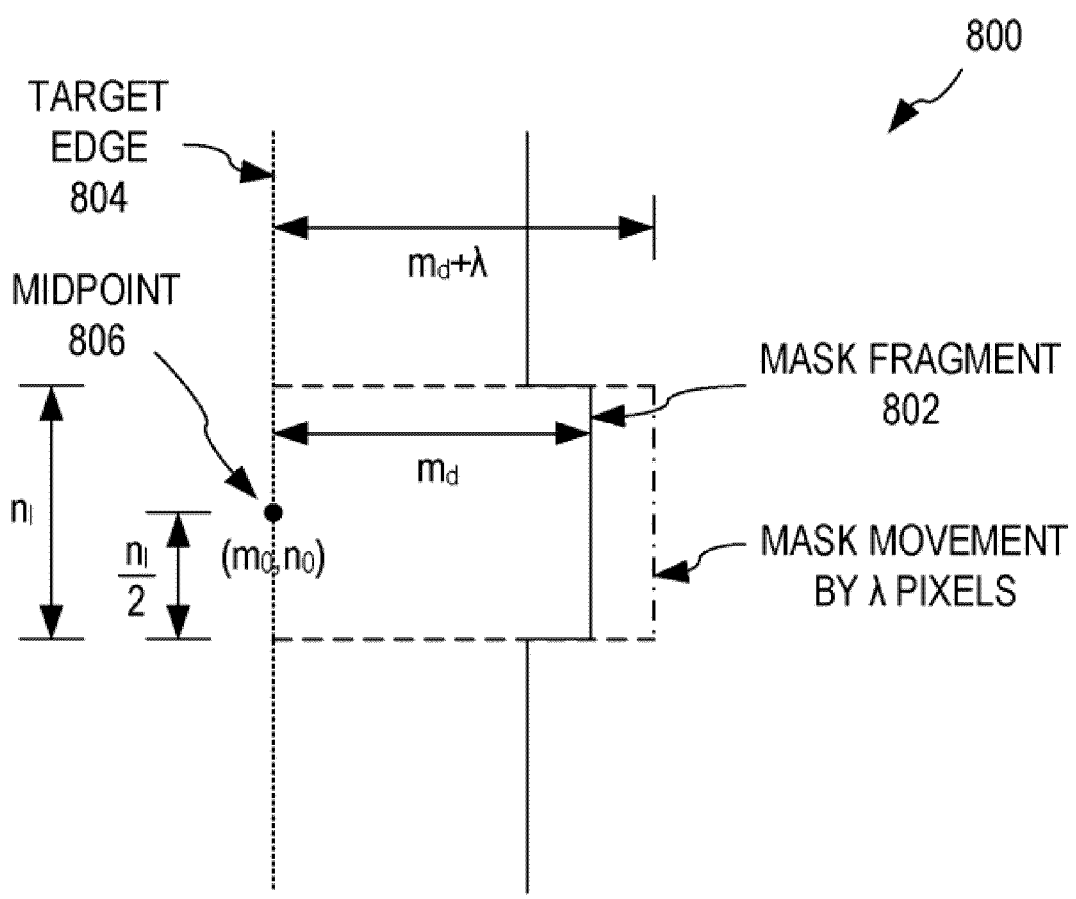
FIG. 8 depicts a movement of a vertical fragment of a target shape in accordance with an illustrative embodiment.

FIG. 8 depicts a movement of a vertical fragment of a target shape in accordance with an illustrative embodiment. FIG. 8 shows fragment 800 of length $n_l$ pixels, where mask fragment 802 is at a distance $m_d$ pixels from target edge 804. This fragment is vertical and hence constrained by an optical proximity correction (OPC) tool to move only along the horizontal direction (x-direction). Assuming that an intensity measurement is performed at the midpoint 806 of the target fragment $(m_0, n_0)$ although the analysis may be extended to multiple measurement sites along the fragment. The intensity at midpoint 806 may be written using Hopkins equations as a sum of coherent systems (SOCS) as follows:

$$I(m_0, n_0) = \sum_{k=1}^{K} \sigma_k E_k(m_0, n_0) E_k^*(m_0, n_0)$$

where $(m_0, n_0)$ is the location of target edge in two dimensional co-ordinate system, $I(m_0, n_0)$ is the intensity at target edge, $E_k(m_0, n_0)$ is the intensity field due to $k^{th}$ optical kernel, $E_k^*(m_0, n_0)$ is the complex conjugate of the intensity field due to $k^{th}$ optical kernel, $\sigma_k$ is the weight of $k^{th}$ intensity field, and K is the total number of optical kernels.

The intensity field due to the $k^{th}$ optical kernel ($E_k$) at the measurement site is a convolution of the mask with the kernel:

$$E_k(m_0, n_0) = \sum_{t_x=-\infty}^{+\infty} \sum_{t_y=-\infty}^{+\infty} M(t_x, t_y) h_k(m_0 - t_x, n_0 - t_y)$$

where $(t_x, t_y)$ are the co-ordinates in two dimensions on mask, $M(t_x, t_y)$ is the mathematical function representing the mask, and $h_k(t_x, t_y)$ is the mathematical function representing the $k^{th}$ optical kernel.

The intensity field slope may be approximated at a given site as the difference between the pixel and neighbor. For a vertical fragment, the slope of interest is in the x-direction. Hence this difference must be taken with respect to its horizontal neighbor. The electric field at the adjoining pixel is also given by another convolution:

$$E_k(m_0 + 1, n_0) = \sum_{t_x=-\infty}^{+\infty} \sum_{t_y=-\infty}^{+\infty} M(t_x, t_y) h_k(m_0 + 1 - t_x, n_0 - t_y)$$

Then the slope in the x-direction of the field at $(m_0, n_0)$ is given by:

$$\nabla E_k^x(m_0, n_0) = E_k(m_0 + 1, n_0) - E_k(m_0, n_0)$$

$$= \sum_{t_x=-\infty}^{+\infty} \sum_{t_y=-\infty}^{+\infty} M(t_x, t_y)$$

$$[h_k(m_0 + 1 - t_x, n_0 - t_y) - h_k(m_0 - t_x, n_0 - t_y)]$$

$$= \sum_{t_x=-\infty}^{+\infty} \sum_{t_y=-\infty}^{+\infty} M(t_x, t_y) \nabla h_k^x(m_0 - t_x, n_0 - t_y)$$

The illustrative embodiment refers to $\nabla h_k$ as $k^{th}$ optical difference kernel for calculating slope. In the horizontal direction the difference kernel is computed as:

$$\nabla h_k^x(m,n) = h_k(m-1,n) - h_k(m,n)$$

This allows us to write the slope of the field as a convolution of the mask and the difference kernel. Now, let the mask edge be moved outward by $\lambda$ pixels. This corresponds to appending an increment to the mask function $M(t_x, t_y)$ which can be quantified as:

$$D(t_x, t_y) = T_l \quad t_x \in (m_d, m_d + \lambda) t_y \in \left[n_0 - \frac{n_l}{2}, n_0 + \frac{n_l}{2}\right]$$

$$D(t_x, t_y) = T_d \quad \text{otherwise}$$

where $D(t_x, t_y)$ is the increment to the mask function on moving a fragment, $\lambda$ is the amount of mask movement (in pixels), $m_d$ is the initial distance of mask edge from target edge, $n_l$ is the length of fragment, $T_l$ is the transmission of light region of the mask, and $T_d$ is the transmission of dark region or background of the mask. For binary masks these values are 1 and 0 respectively, but can be different for masks that use attenuated phase shift masking. Thus, a new intensity field may be calculated at $(m_0, n_0)$ analytically as:

$$E_k(\lambda, m_0, n_0) = \sum_{t_x=-\infty}^{+\infty} \sum_{t_y=-\infty}^{+\infty} [M(t_x, t_y) + D(t_x, t_y)] \cdot$$

$$h_k(m_0 - t_x, n_0 - t_y)$$

$$= E_k(m_0, n_0) + (T_d - T_l) \sum_{i=1}^{\lambda} \sum_{j=n_l/2}^{n_l/2} h_k(m_d + i, j)$$

The additional field due to mask movement may therefore be written in terms of the optical kernel only:

$$H_k^x(\lambda, m_d, n_l) = (T_d - T_l) \sum_{i=1}^{\lambda} \sum_{j=n_l/2}^{n_l/2} h_k(m_d + i, j)$$

this increment $(H_k^x)$, which is the increment in the $k^{th}$ intensity field due to mask movement in the horizontal direction, may then be pre-computed for various combinations of mask movement ($\lambda$), fragment length ($n_l$), and fragment distance ($m_d$). Such pre-computations are stored in lookup tables for fast retrieval during image computation.

The change in slope of the kth intensity field resulting from mask movement may similarly be written using similar expressions combined with the difference kernel. The slope increment may be similarly pre-computed and stored as:

$$\nabla E_k^x(\lambda, m_0, n_0) = \nabla E_k^x(m_0, n_0) + (T_d - T_l) \sum_{i=1}^{\lambda} \sum_{j=n_l/2}^{n_l/2} \nabla h_k^x(m_d + i, j)$$

$$= \nabla E_k^x(m_0, n_0) + \nabla H_k^x(\lambda, m_d, n_l)$$

where $H_k^x$ is the increment in the $k^{th}$ intensity field due to mask movement in the horizontal direction, $H_k^{x*}$ is the complex conjugate of the increment in the $k^{th}$ intensity field due to mask movement in the horizontal direction, $\nabla E_k^x$ is the slope of the $k^{th}$ intensity field in the horizontal direction, $\nabla E_k^{x*}$ is the complex conjugate of the slope of the $k^{th}$ intensity field in the horizontal direction, and $\nabla H_k^x$ is the increment in the slope of the $k^{th}$ intensity field due to mask movement in the horizontal direction, and $\nabla H_k^{x*}$ the complex conjugate of the slope of the $k^{th}$ intensity field due to mask movement in the horizontal direction.

Using Hopkins equations as a sum of coherent systems (SOCS), a new image intensity may be written in terms of the modified fields as:

$$I^\lambda(m_0, n_0) = \sum_{k=1}^{K} \sigma_k [E_k(m_0, n_0) + H_k^x(\lambda, m_d, n_l)] \cdot$$

$$[E_k^*(m_0, n_0) + H_k^{x*}(\lambda, m_d, n_l)]$$

where $I^\lambda(m_0, n_0)$ is the new intensity after movement of mask by $\lambda$ pixels.

A further simplifying assumption may be made that the movement of the mask edge is small enough such that the increment in field is small in comparison to the electric field itself, i.e. $H_k \ll E_k$. Expanding the equation and neglecting the small $|H_k|^2$ term, the change in image intensity may be written as:

$$\delta I^\lambda(m_0, n_0) = \sum_{k=1}^{K} \sigma_k [E_k(m_0, n_0) H_k^{x*}(\lambda, m_d, n_l) + E_k^*(m_0, n_0) H_k^x(\lambda, m_d, n_l)]$$

where $\delta I^\lambda(m_0, n_0)$ is the change in the intensity after movement of mask by $\lambda$ pixels.

This equation allows for a prediction of the impact of a small amount of mask movement on the magnitude of intensity at the target edge. To observe the impact on slope, an expression is obtained for image gradient in terms of the intensity fields by differentiating the Hopkins equations as a sum of coherent systems (SOCS) as follows:

$$\nabla I_x(m_0, n_0) = \sum_{k=1}^{K} \sigma_k [E_k(m_0, n_0) \nabla E_k^{x*}(m_0, n_0) + E_k^*(m_0, n_0) \nabla E_k^x(m_0, n_0)]$$

where $\nabla I_x$ is the slope of the intensity in the x-direction $\nabla E_k^x$ is the complex conjugate or the slope of the $k^{th}$ intensity field.

A similar assumption may be made as above that the alteration in mask position is small enough such that change in slope is small compared to the magnitude of the slope. Expanding the above expression the slope increment above to write the change in image gradient in terms of the optical kernels, results in the following:

$$\delta \nabla I^\lambda(m_0, n_0) = \sum_{k=1}^{K} \sigma_k \left[ \begin{array}{l} \nabla E_k^x(m_0, n_0) H_k^{\lambda^*}(\lambda, m_d, n_l) + \nabla E_k^{x^*}(m_0, n_0) H_k^{\lambda}(\lambda, m_d, n_l) + \\ E_k(m_0, n_0) \nabla H_k^{\lambda^*}(\lambda, m_d, n_l) + E_k^*(m_0, n_0) \nabla H_k^{\lambda}(\lambda, m_d, n_l) \end{array} \right]$$

The increment terms for both intensity and slope are available from lookup tables, while the field and slope terms are available during the process of image simulation. Given the knowledge of the simulation sites, in this case midpoint 806 of each fragment, the impact of mask movement for each fragment on the image profile may be calculated.

The above set of equations have been derived for a vertical fragment. Similar expressions can also be developed for horizontal fragments, with the primary difference being that the intensity slope is now computed in the vertical direction using the appropriate difference kernel. The illustrative embodiments also gauge the effect of movement in target edge on the profile of the intensity. Since the intensity measurements are made at the target edge, a movement of the target edge corresponds to a shift in the measurement point. With these equations in place, for the same fragment shown in FIG. 6, assuming that a target movement of η pixels and mask movement of λ pixels, in this case the cost function for the fragment may be written as:

$$C_{SMATO}^j(\lambda,\eta) = w_j [I(m_0,n_0+\eta) + \delta I^\lambda(m_0,n_0+\eta) - I_{th}]^2 + (1 - w_j)[\nabla I(m_0,n_0+\eta) + \delta \nabla I^\lambda(m_0,n_0+\eta)]^{-1}$$

The development of these equations has been to capture the impact of fragment movement on the simulation site at the fragment itself. However, the set of equations may be extended to capture cross-effects as well where a prediction may be made at the impact of moving neighboring fragments on the image profile at a site. The evaluation of the cost function happens in situ, i.e. during the time of generating the image. The use of lookup tables speeds up this computation, thus ensuring only a small overhead is added to the image generation runtime.

Figure 9A:
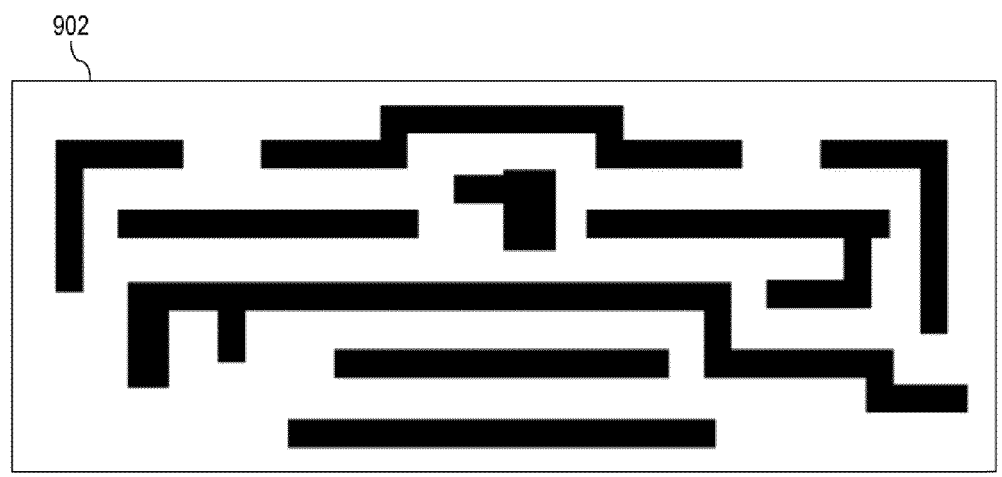
FIGS. 9A-9F depict an example of retargeting performed by simultaneous mask and target optimization (SMATO) mechanism using mask and target movement analysis in accordance with an illustrative embodiment.
Figure 9B:
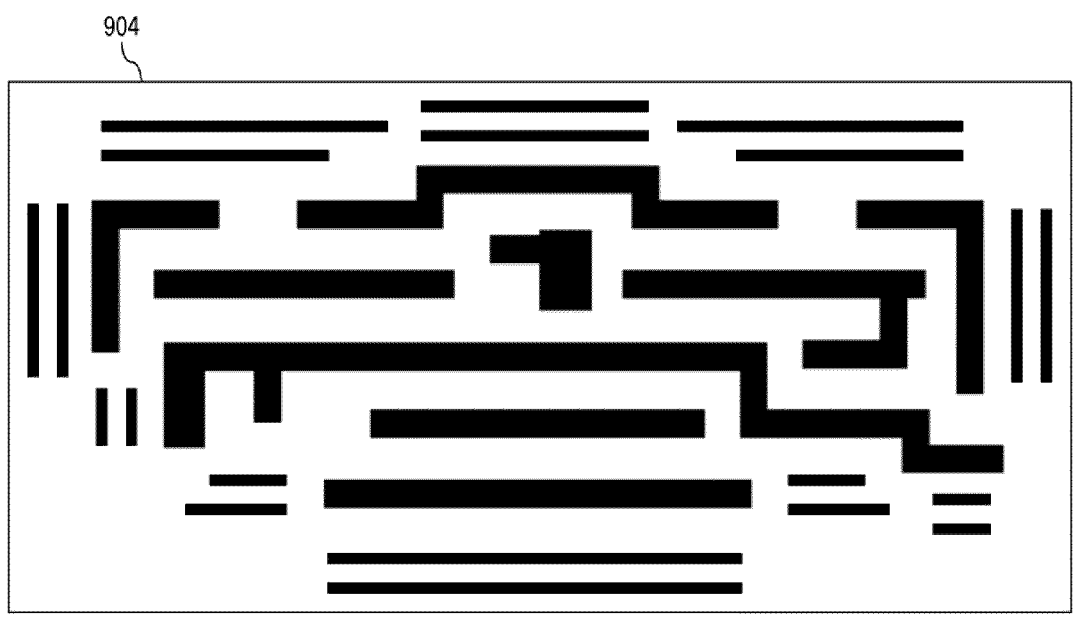
Figure 9C:
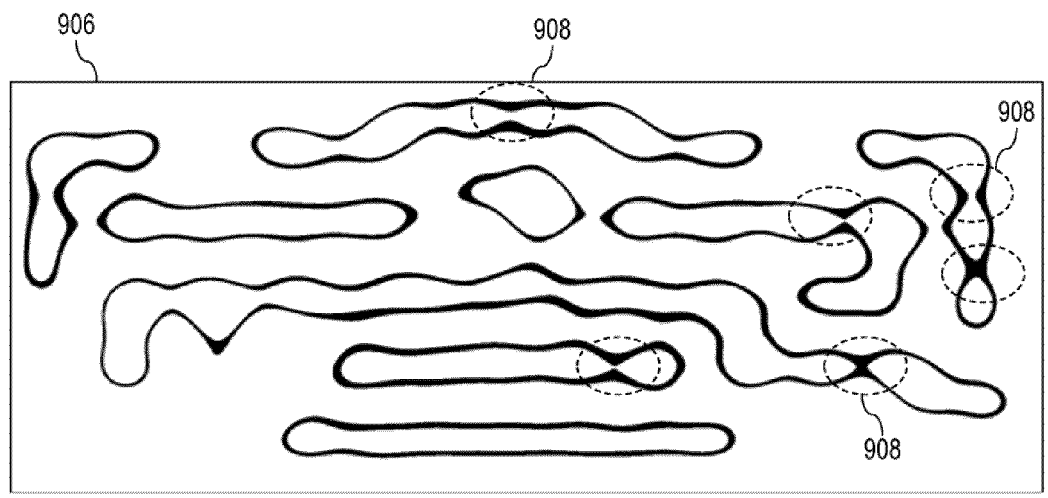
Figure 9D:
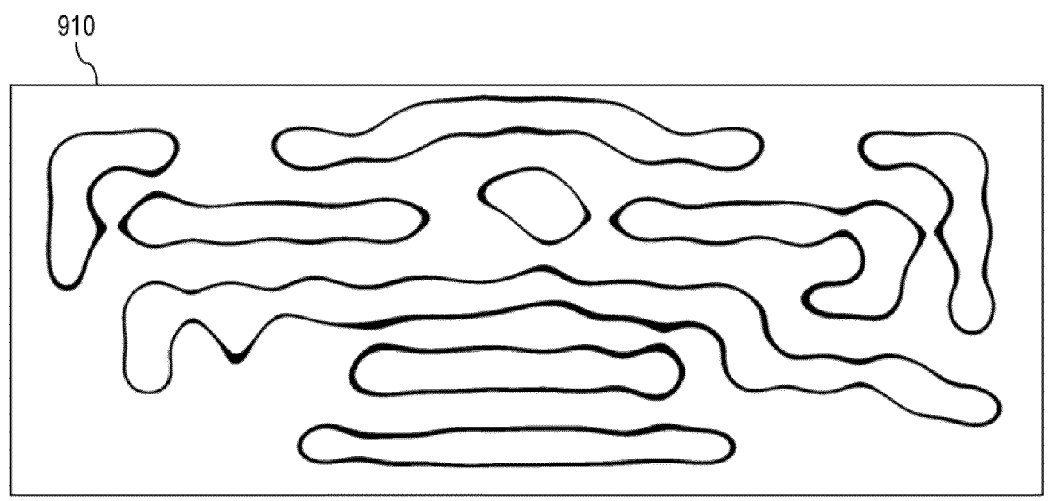
Figure 9E:
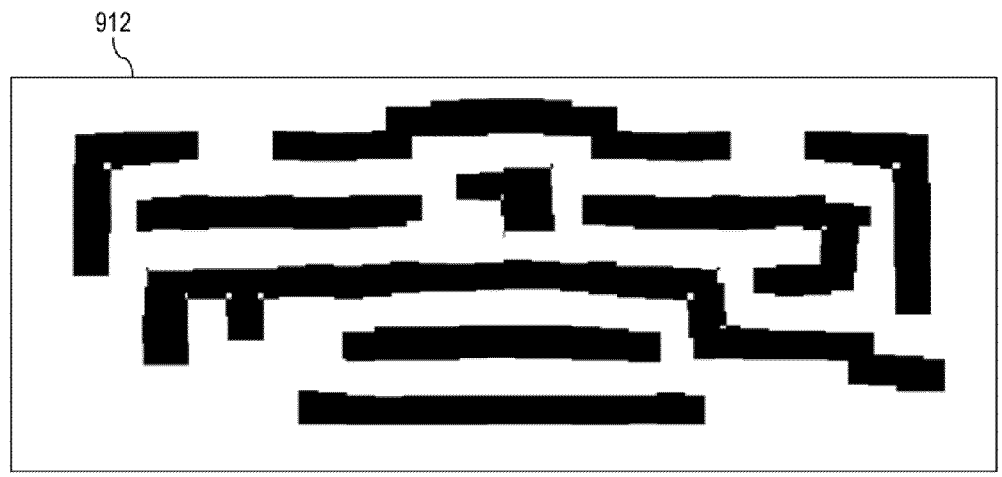
Figure 9F:
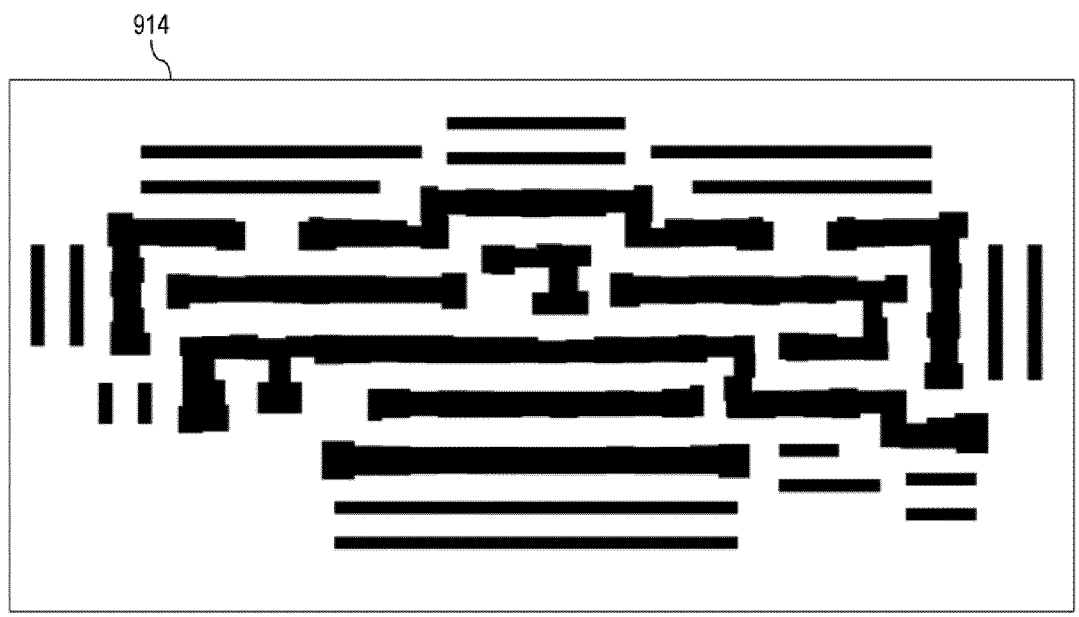

FIGS. 9A-9F depict an example of retargeting performed by simultaneous mask and target optimization (SMATO) mechanism using mask and target movement analysis in accordance with an illustrative embodiment. FIG. 9A depicts initial target shape 902 used by the SMATO mechanism. FIG. 9B depicts initial mask shape 904 generated by the SMATO mechanism. Without simultaneous mask and target optimization, FIG. 9C depicts final photolithographic layout 906, which indicates areas of shorting 908. These results show that in the absence of simultaneous mask and target optimization, the image fidelity and robustness is not-maintained. FIG. 9D illustrates final photolithographic layout 910 where simultaneous mask and target optimization removes the probability of shorting. FIG. 9E depicts modified target shape 912 produced using the SMATO mechanism described in FIG. 7 and FIG. 9F depicts modified mask 914 produced using the SMATO mechanism described in FIG. 7.

Thus, the simultaneous mask and target optimization (SMATO) mechanism of the illustrative embodiments provides a more scalable approach compared to rule-based retargeting. The SMATO mechanism may enable the capturing of instances that are not specified in known rules and may also be more context aware as the same structure may get different retargeting in different environments. Thus, the SMATO mechanism performs true simultaneous mask and target optimization based on analytical sensitivities as compared to previous solutions that perform mask and target optimization, one at a time, in separate iterations.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Figure 10:
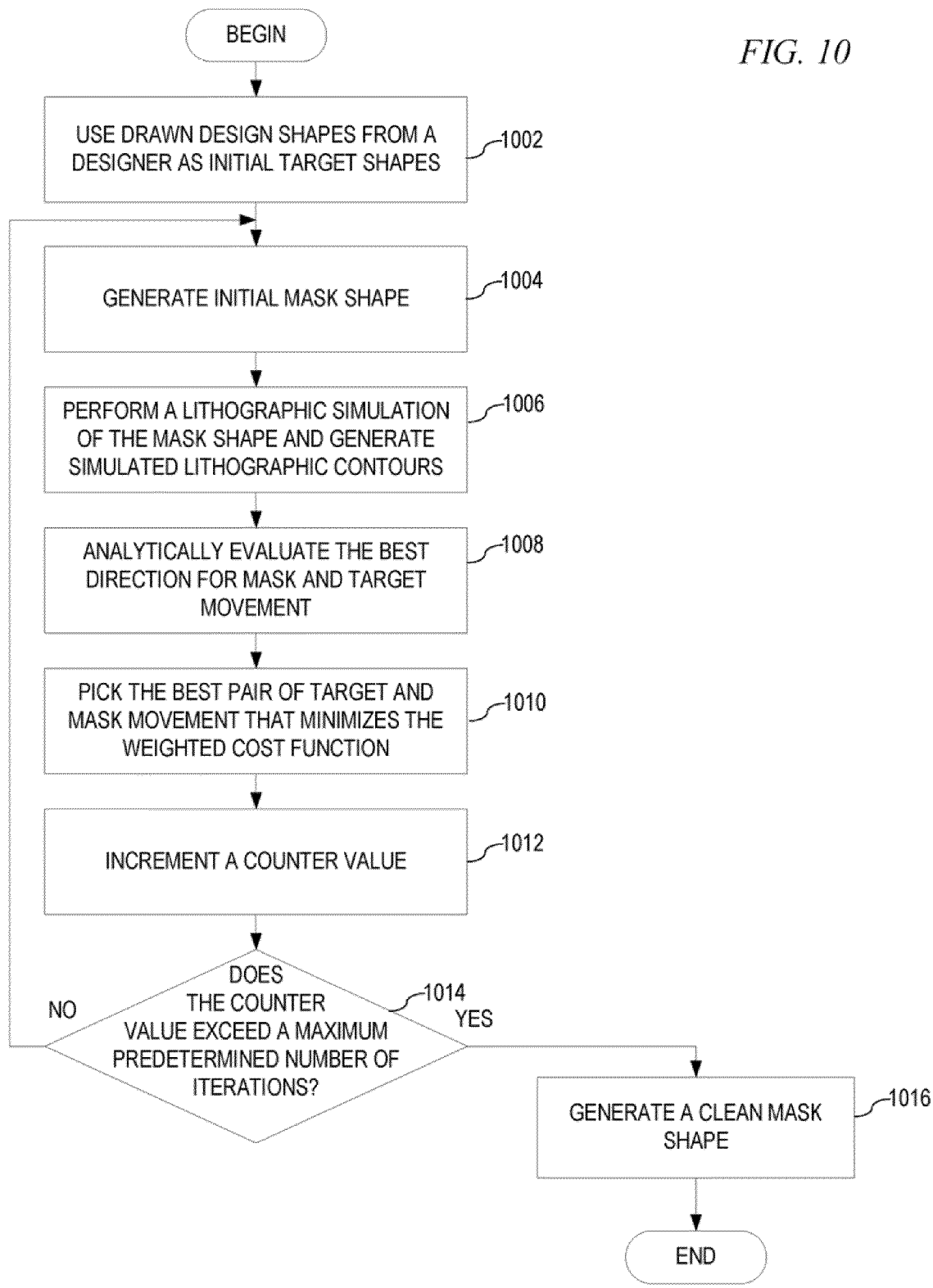
FIG. 10 provides a flowchart outlining example operations performed by a simultaneous mask and target optimization (SMATO) in accordance with an illustrative embodiment.

Referring now to FIG. 10, this figure provides a flowchart outlining example operations performed by a simultaneous mask and target optimization (SMATO) in accordance with an illustrative embodiment. As the operation begins, the SMATO mechanism uses drawn design shapes from a designer as initial target shapes (step 1002). The SMATO mechanism generates initial mask shape (step 1004). The initial mask shape generated by the SMATO mechanism may be substantially the same as the initial target shape. A lithographic simulator in the SMATO mechanism then performs a lithographic simulation of the mask shape and generates an image of the mask on a wafer, which may be referred to as simulated lithographic contours using models of the lithographic process (step 1006). A mask and target movement module then analytically evaluates the best direction for mask and target movement by determining the weighted cost function for each of nine points generated by moving the: mask in, mask out, no mask movement, target in, target out, and no target movement (step 1008). The mask and target movement module then picks the best pair of target and mask movement that minimizes the weighted cost function (step 1010).

Each time the mask and target movement module performs the analysis of moving the mask and target and picks the best pair of target and mask movement that minimizes the weighted cost function, an iteration counter increments a counter value (step 1012). The SMATO mechanism determines if the counter value of the iteration counter has exceeded a maximum predetermined number of iterations (step 1014). If at step 1014 the counter value of the iteration counter has failed to exceed the maximum predetermined number of iterations, then the operation returns to step 1004 where a new mask is generated. If at step 1014 the counter value of the iteration counter has exceeded a maximum predetermined number of iterations, the SMATO mechanism generates one or more clean mask shapes (step 1016), with the operation ending thereafter.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Thus, the illustrative embodiments provide a mechanism for simultaneous optimization of a target and a mask to achieve image fidelity and improved robustness of photolithographic layouts. The simultaneous optimization uses a weighted function of image log slope (ILS) and intensity error to balance fidelity and robustness. Higher image slope gives more robustness to process variation and lower intensity error gives better image fidelity. Optimization is guided by an analytical computation of sensitivity of cost function for mask and target movement.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for simultaneous photolithographic mask and target optimization (SMATO), the method comprising:
generating, by a lithographic simulator, an image of a mask shape on a wafer thereby forming one or more lithographic contours;
analytically evaluating, by a mask and target movement module, a direction for mask and target movement thereby forming a plurality of pairs of mask and target movements;
identifying, by the mask and target movement module, a best pair of mask and target movements from the plurality of mask and target movements that minimizes a weighted cost function; and
adjusting, by a shape adjustment module, at least one of a target shape or the mask shape based on the best pair of mask and target movements.

2. The method of claim 1, wherein the best pair of mask and target movements indicates that the target shape should move in by a first predetermined distance and the mask shape should move in by a second predetermined distance.

3. The method of claim 1, wherein the best pair of mask and target movements indicates that the target shape should not move and the mask shape should move in by a second predetermined distance.

4. The method of claim 1, wherein the best pair of mask and target movements indicates that the target shape should move out by a first predetermined distance and the mask shape should move in by a second predetermined distance.

5. The method of claim 1, wherein the best pair of mask and target movements indicates that the target shape should move in by a first predetermined distance and the mask shape should not move.

6. The method of claim 1, wherein the best pair of mask and target movements indicates that the target shape should not move and the mask shape should not move.

7. The method of claim 1, wherein the best pair of mask and target movements indicates that the target shape should move out by a first predetermined distance and the mask shape should not move.

8. The method of claim 1, wherein the best pair of mask and target movements indicates that the target shape should move in by a first predetermined distance and the mask shape should move out by a second predetermined distance.

9. The method of claim 1, wherein the best pair of mask and target movements indicates that the target shape should not move and the mask shape should move out by a second predetermined distance.

10. The method of claim 1, wherein the best pair of mask and target movements indicates that the target shape should move out by a first predetermined distance and the mask shape should move out by a second predetermined distance.

11. The method of claim 1, wherein the weighted cost function is:

$$C_{SMATO}(m_0, n_0, n_m) = w_i[I(m_0, n_0) + \delta I^{n_m}(m_0, n_0) - I_{th}] + (1 - w_i)\frac{1}{(\nabla I(m_0, n_0) + \delta \nabla I^{n_m}(m_0, n_0))}$$

wherein $(m_0, n_0)$ is an initial location of a center of a target edge in the target shape, wherein $n_m$ is movement in the mask shape, and wherein $w_i$ is the weight.

12. The method of claim 11, wherein the weight $w_i$ in the weighted cost function is dynamically tunable at each iteration to improve convergence to a mask and target solution, wherein the dynamic tuning weights either an intensity error higher for a predetermined number of iterations to bring the lithographic contours closer to the target or the intensity slope higher to improve robustness.

13. The method of claim 12, wherein the analytical evaluation of the intensity error occurs in a pixel-based simulation domain.

14. The method of claim 12, wherein the analytical evaluation of the intensity slope occurs in a pixel-based simulation domain.

15. The method of claim 12, wherein the analytical evaluation is sped up by using lookup tables characterized for fragments of different lengths and different amounts of mask movements.

16. The method of claim 12, wherein the analytical evaluation is sped up by using lookup tables characterized for fragments of different lengths and different amounts of target movements.

17. The method of claim 11, wherein the weighted cost function is analytically computed by using a SOCS decomposition of a Hopkins equations and obtains the amount of perturbation in terms of the optical kernels.

18. The method of claim 1, further comprising:
repeating, by the data processing system, the steps of generating, analytically evaluating, identifying, and adjusting a predetermined number of times; and
responsive to the predetermined number of times being met, generating, by the data processing system, a set of clean mask shapes.

19. A computer program product comprising a computer readable storage medium having a computer readable program stored therein, wherein the computer readable program, when executed on a computing device, causes the computing device to:
generate an image of a mask shape on a wafer thereby forming one or more lithographic contours;
analytically evaluate a direction for mask and target movement thereby forming a plurality of pairs of mask and target movements;
identify a best pair of mask and target movements from the plurality of mask and target movements that minimizes a weighted cost function; and
adjust at least one of a target shape or the mask shape based on the best pair of mask and target movements.

20. An apparatus, comprising:
a processor; and
a memory coupled to the processor, wherein the memory comprises instructions which, when executed by the processor, cause the processor to:
generate an image of a mask shape on a wafer thereby forming one or more lithographic contours;
analytically evaluate a direction for mask and target movement thereby forming a plurality of pairs of mask and target movements;
identify a best pair of mask and target movements from the plurality of mask and target movements that minimizes a weighted cost function; and
adjust at least one of a target shape or the mask shape based on the best pair of mask and target movements.

* * * * *